United States Patent
German et al.

[11] 4,119,876
[45] Oct. 10, 1978

[54] ELECTRODE STRUCTURE FOR AN ELECTRIC DISCHARGE DEVICE

[76] Inventors: Valentin Ostapovich German, ulitsa akademika Pavlova, 28, Moscow; Jury Pavlovich Kukota, ulitsa Kirova, 34a, kv. 22, Kiev; Grigory Alexandrovich Ljubimov, Rostovskaya naberezhnaya, 1, kv. 60, Moscow; Boris Vladimirovich Parfenov, Spiridonievsky pereulok, 12/9, kv. 6, Moscow; Alexandr Nikolaevich Popov, ulitsa marshala Timoshenko, 28, kv. 58, Moscow; German Mikhailovich Schegolev, bulvar Likhacheva, 3, kv. 10, Kiev, all of U.S.S.R.

[21] Appl. No.: 729,265
[22] Filed: Oct. 4, 1976
[51] Int. Cl.² .............................................. H05H 1/00
[52] U.S. Cl. .................... 313/231.4; 219/75; 219/121 P
[58] Field of Search ............... 313/231.3, 231.4, 231.5, 313/210, 209; 219/121 P, 75

[56] References Cited
U.S. PATENT DOCUMENTS

| | | | |
|---|---|---|---|
| 3,027,447 | 3/1962 | Browning et al. | 219/75 |
| 3,343,022 | 9/1967 | Eckert | 313/231.3 |
| 3,376,468 | 4/1968 | Hirt et al. | 219/121 P X |
| 3,731,047 | 5/1973 | Mullen et al. | 313/231.3 X |
| 3,830,428 | 8/1974 | Dyos | 219/121 P X |

FOREIGN PATENT DOCUMENTS 2,429,924  1/1976  Fed. Rep. of Germany ........ 313/231.4

*Primary Examiner*—Palmer C. Demeo
*Attorney, Agent, or Firm*—Lackenbach, Lilling & Siegel

[57] ABSTRACT

An electrode structure for use in an electric discharge device includes a fluid-permeable discharge chamber; a flow of gas seeded with actively emissive elements is delivered to the interior surface of said discharge chamber for a distributed electric discharge to be maintained thereat. The discharge chamber is fitted with an opening providing for a discharge channel outlet. Service life of the proposed electrode structure reaches several thousands of hours, which is possible due to erosion inhibition at the discharge surface. Simplicity of design, reasonable weight and dimensions of the electrode structure renders it suitable for use as an electrode in plasmatrons employed in chemical industry and metallurgy, as well as an electrode for electric arc melting furnaces. The electrode structure can also be used as a welding electrode, and as an electrode for MHD generators and other electric discharge devices with electric arc heating process being used therein.

5 Claims, 6 Drawing Figures

ELECTRODE STRUCTURE FOR AN ELECTRIC DISCHARGE DEVICE

The present invention relates to electrode structures, and more particularly to an electrode structure for use in an electric discharge device.

An electrode structure of the invention is best suitable for use as an electrode in plasmatrons employed in chemical industry and metallurgy as well as an electrode for electric arc melting furnaces. The proposed electrode structure may also be advantageously used as a welding electrode operating at currents over 500 A, and as an electrode for MHD generators and other electric discharge devices wherein electric discharge in a gas is made use of.

Known in the art electrode structures used for electric discharge devices, for example electrode structures for plasmatrons, MHD generators, electric arc melting furnaces, no matter what their design or sphere of application might be, suffer from an essential disadvantage, namely: service life of their electrode is short due to destruction thereof caused by the arc erosion. This happens because of the arc spot occuring on the electrode discharge surface, the arc spot temperature reaching about 4000° C., the current density therein being several thousands of amperes per square centimetre /5000 A/cm$^2$/.

The known electrode structures, made of copper, steel, graphite, tungsten, zirconium dioxide and other materials, are characterized by high rate of erosion ranging from $10^{-2}$ to $10^{-6}$ g/C and over. Service life of the known electrodes ranges from 50 to 200 hours, which necessitates their frequent replacement in electric discharge devices, thus barring them from being employed in production lines with a continous operation process.

An increase in production capacity per unit of electric arc heaters can be attained either by increasing the potential difference between the electrodes or by stepping up current load. Known in the art are electrode structures (plasmatrons) operating at the potential difference of 1.0; 3.5; 6.0 or 10 kV. However, an increase in the potential difference leads to increased labour protection requirements, much higher cost, more complicated design and servicing of electric discharge devices.

Higher current load results in a higher rate of erosion of electrodes at the point of contact of the arc spot with the electrode surface. Thermal and electrical processes, occuring at the point of arc contact, are decisive factors causing electrode destruction.

Two approaches have been traditionally taught in the art for increasing the service life of the electrodes, one of these being the use of non-stationary effect phenomena and the other, employment of "hot" electrodes.

The first approach is used to distribute the heat flux from the arc spot over a substantial portion of the surface area.

There is known an electrode structure for a plasmatron, wherein a coil is provided, establishing a magnetic field to allow the arc spot transfer along the interior surface of the electrode and thereby inhibit the electrode erosion.

The second approach envisages the use of refractory materials, such as tungsten, lanthanum, thorium, etc., which results in a higher melting point of the electrode and its operability at temperatures close to the melting point of the aforesaid materials. Therewith, the heat flux from the arc spot and onto the electrode surface is reduced due to a decrease in the temperature gradient between the arc column in the proximity of the electrode and the electrode proper.

Other methods to diminish erosion are based on splitting the arc in the proximity of the electrode periphery, or on distributing the current distribution among a plurality of electrically isolated electrodes.

Much attention has also been paid to diffusion-arc electrodes as well.

However, all the aforementioned methods used for inhibiting erosion of electrodes in electrode structures provide but for an increase of the electrode service life as small as 20–30 percent.

The main disadvantage of all the aforesaid erosion inhibition techniques applied to electrodes in the electrode structures is the presence of an arc spot on the electrode surface, and, consequently, the occurence of a rather high temperature in the arc spot periphery exceeding the melting point of the electrode material, which causes the electrode destruction (evaporation, splashing of the melted material, "burning-out" of alloying additives).

Therefore, the problem of essentially increasing the service life of electrode structures can be solved only through eliminating the main cause of the electrode destruction, i.e. the arc spot.

Known in the art is an electrode structure for an MHD generator, comprising a porous base member with a protective gas, seeded with actively emissive elements, being passed therethrough. One of the surfaces of this electrode is the discharge surface while the other one being connected with supply means of protective gas with a seeding, passing through the porous base member of the electrode structure.

Passing through the electrode, the protective gas, seeded with actively emissive elements, forms a boundary electrically conducting layer between the discharge surface and a flow of the working fluid, which provides for the current flow and protection of the electrode against erosion.

However, this type of electrode structure suffers from a number of disadvantages.

The electrode structure mentioned above operates at low current loads, this being the reason for its limited application. It cannot be widely used as an electrode in plasmatrons, electric arc heating furnaces, or as a welding electrode, the electrode for MHD generators and other electric discharge devices, since with limited current loads and the use of a specific supply source only insignificant unit power can be obtained in one installation. The use of higher voltage in a power source is limited since it imposes increased labour protection requirements and economic considerations.

The electrode discharge surface is in direct contact with the MHD generator working zone having a flow of combustion products therein, oxygen included. Therefore, to form a boundary layer efffective enough to render protection to an electrode against erosion and corrosion, intensive flow rate of gas is required, while to maintain the required electrical conductance of the boundary protective layer, substantial consumption of actively emissive elements will be needed.

It is an object of the present invention to increase the service life of electrode structures for an electric discharge device through diminishing erosion of the electrode discharge surface.

Another object of the invention is to provide a general-purpose electrode structure for use in various electric discharge devices, for example, in plasmatrons, electric arc melting furnaces, MHD generators, welding sets, and the like.

These and other objects of the invention are attained by providing an electrode structure for an electric discharge device, comprising a fluid-permeable electrode with a gas seeded with actively emissive elements being passed therethrough, according to the invention, the electrode is made as a discharge chamber with the interior surface thereof being used for a distributed electric discharge to be maintained thereat, said discharge chamber being fitted with an opening providing for a channel discharge outlet.

It is possible to make only a part of the chamber fluid-permeable.

To reduce the flow rate of gas and that of actively emissive elements, and to isolate the chamber from the working zone of the electrode structure, it is preferable that a neck be attached to the providing for the discharge channel outlet, said neck being made of a gas-permeable material and fitted with an inlet for delivering a flow of protective gas therethrough, said protective gas forming a blanketing gas layer barring aggressive elements from passing into the chamber. The chamber may be fitted with an opening for a rod-shaped electrode to be fixed therein, said electrode being intended for striking an arc and made movable within the chamber.

The herein proposed design of the electrode structure for use in an electric discharge device will make it possible to obtain a distributed discharge at the electrode discharge surface, that is, a discharge with no arc spot.

The presence of the distributed discharge at the electrode discharge surface diminishes the rate of erosion by several orders of magnitude as compared with the best prior-art structures.

This in turn allows a drastic increase in the service life of the proposed electrode structure, extending it to several dozens of thousands of hours.

Substantially higher current loads as compared to those used in the known structures, simplicity of design, reasonable weight and dimensions of the herein-disclosed electrode structure, make is fit for use as the electrode for plasmatrons, employed in chemical industry and metallurgy, as well as in electric arc melting furnaces. The electrode structure can also be used as the welding electrode operating under currents over 500 A, and as the electrode for MHD generators and other electric discharge devices wherein electric discharge in gas is made use of.

The electrode structure of the invention may be employed in devices with various working media namely: neutral, oxidizing, reduction.

The proposed design provides for an ever wider range of construction materials to be utilized for high-temperature electrode structures used in electric discharge devices.

Employment of the proposed electrode structures in metallurgy brings about an improvement in the quality of steel as well as in melting processes.

The electrode structure of the proposed design substantially reduces the degree of contamination of the working zone with admixtures of the electrode materials, which feature will facilitate to solve the problem of remelting scrap nickel, tungsten, molybdenum, titanium and other refractory materials, the treatment of which still poses appreciable difficulty today.

The proposed structure may serve as a basis for creating single-unit plants capable of long-term operation, as powerful as 10 to 20 MW and over for use in plasma-chemistry, which is not feasible insofar as the prior-art electrode structures are concerned.

The proposed electrode structure is advantageous in that it can be employed both in continuous or long-term operation systems (with working time amounting to thousands of hours) and in the presently existing systems without requiring radical modifications.

Other objects and advantages of the present invention will become apparent from a consideration of the following detailed description taken in conjunction with the accompanying drawings, wherein.

Figure 1:
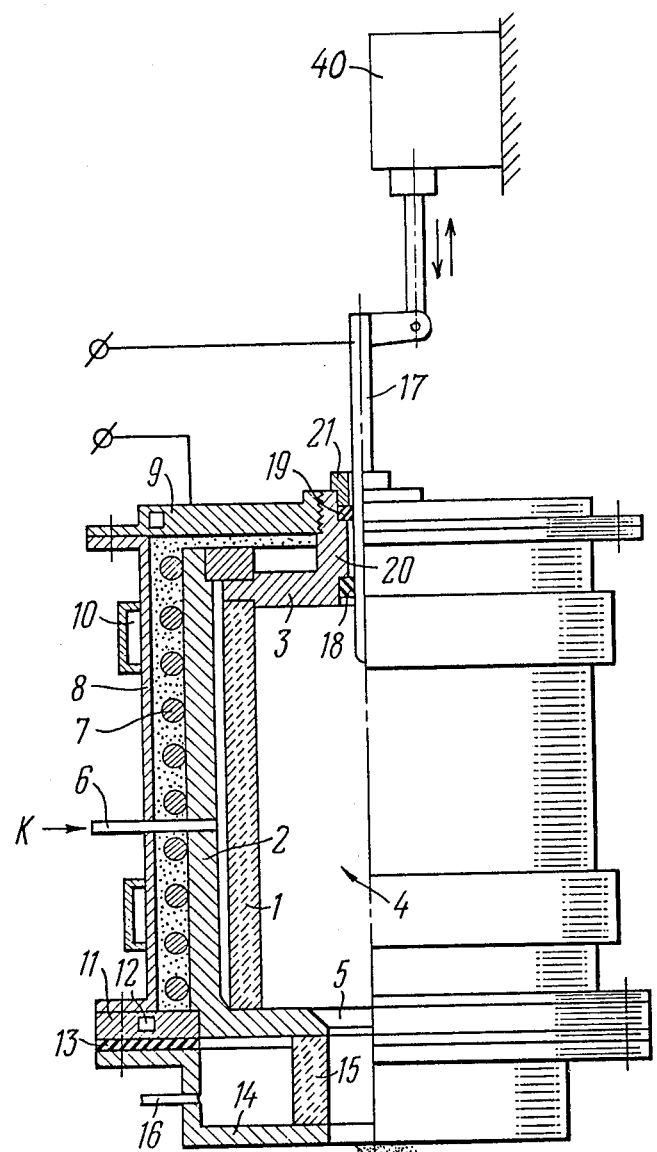
FIG. 1 shows a partial longitudinal section of an electrode structure for an electric discharge device according to the invention.
Figure 1:
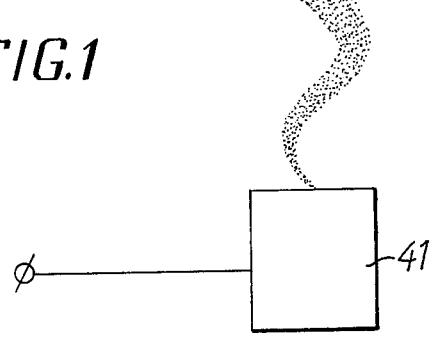

An electrode structure for an electric discharge device includes a fluid-permeable electrode 1 (FIG. 1); a discharge chamber 4 having a wall made in the form of a pipe of a heat resistant, fluid permeable, electrically conductive material, for instance, zirconium diboride ZrBz. The wall 1 functions as the electrode. The cover 3 of the discharge chamber, the wall 1 and the bottom of the body 2 define an inner space of a discharge chamber 4. The bottom of the body 2 has an opening 5 which serves as a discharge channel outlet.

The body 2 and walls of the discharge chamber 4 define an inner space for a flow of gas, seeded with actively emissive elements, to be delivered thereinto along a pipeline 6. Use can be made of such gases as argon, nitrogen and others, while potassium, sodium, rubidium, etc., can be used as actively emissive elements.

A heater 7, intended for pre-heating the discharge chamber 4, adjoins the exterior surface of the body 2. The aforecited elements of the electrode structure are mounted within a housing 8 provided with a top cover 9. The space between the housing 8 and the body 2 is filled with a heat-insulating material, for example, corundum, boron nitride, etc.

The bottom of the body 2 is connected with a flange 11 fitted with a duct 12 for cooling. Contiguous to the flange 11 from one side thereof is the housing 8, while from the other side said flange is adjoined with a bottom plate 14 through an insulator 13, said bottom plate 14 urging the neck 15 to the opening 5 in the body 2 of the discharge chamber 4, said neck 15 being intended for isolating the discharge chamber 4 from the working zone of the electrode structure. Besides, the neck 15 serves to bar aggressive elements from passing into the discharge chamber 4. This is made possible due to a blanketing gas layer formed by overlapping boundary layers.

With this purpose in view, the neck 15 is made fluid-permeable, and the space defined by the exterior surface of the neck 15 and the bottom plate 14 is used as a collector means for uniform distribution of the protective gas. Such gases as argon, nitrogen and others can be used as protective gases. A flow of gas is delivered into said space along a pipeline 16.

The cover 3 is fitted with an opening for a rod-shaped electrode 17 to be inserted therethrough into the discharge chamber 4, said electrode 17 having its one end resting on a ring 18 fixed in the cover 3, the other end thereof resting on a packing 19 disposed within a lead-in 20 being electrically associated with the discharge chamber 4. The lead-in 20 has a nut 21 screwed thereon, said nut being intended for adjusting the tightening of the packing 19.

The discharge chamber 4 may vary as to the shape thereof.

The selection of a particular shape of the chamber 4 is dictated by the conditions required for the interaction between the heated substance and the discharge channel; it should be such as to ensure both easy manufacture of the chamber and its adequate functioning in the electric discharge device adapted to serve a particular purpose.

The design of the discharge chamber 4 makes it possible to deliver actively emissive elements to the interior surface of the chamber. It is expedient, therefore, that the discharge chamber 4 be made fluid-permeable.

Figure 2:
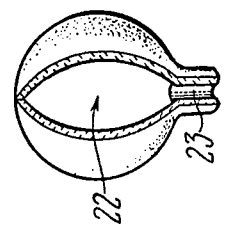
FIG. 2 shows a partial cross-section of a sphere-shaped chamber of an electrode structure in accordance with the invention.

FIG. 2 illustrates a discharge chamber 22, sphere-shaped, having an opening 23 providing for a discharge channel outlet. The walls of the discharge chamber 22 are made of a material featuring transverse porosity for actively emissive elements to have free access to the interior surface of said chamber.

Figure 3:
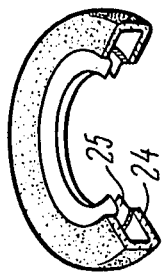
FIG. 3 illustrates a torus-shaped discharge chamber.

FIG. 3 shows a torus-shaped discharge chamber 24 with an opening 25 having the form of a slit, said opening providing for a discharge channel outlet. The walls of the chamber are made of material featuring transverse porosity for actively emissive elements to pass therethrough to the interior surface of said chamber. To ensure passage of actively emissive elements, it is possible to make only a portion of the chamber walls fluid-permeable, as shown in FIGS. 4, 5, 6.

Figure 4:
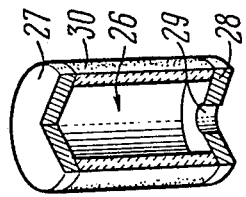

FIG. 4 illustrates a cylinder-shaped discharge chamber 26 having a cover 27 and a bottom 28 with an opening 29 providing for a discharge channel outlet, said bottom with the opening thereof being made of a fluid-tight material. It is only the wall 30 of the chamber 26 that is made fluid-permeable.

Figure 5:
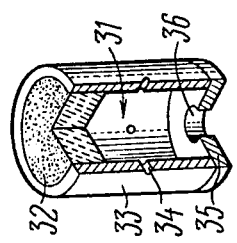
FIGS. 4 and 5 illustrate cylinder-shaped discharge chambers.
Figure 6:
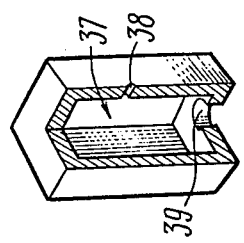
FIG. 6 shows a discharge chamber in the shape of a parallelepiped.

FIG. 5 shows a cylinder-shaped discharge chamber 31 with a face 32 thereof being made fluid-permeable of a material featuring transverse porosity.

Fluid-permeability is assured by the provision of openings 34 in a wall 33. A bottom 35 of the discharge chamber 31 is fitted with an opening 36 providing for a discharge channel outlet.

Shown in FIG. 6 is a discharge chamber 37 shaped as a parallelepiped and defined by flat wall members. Admission of actively emissive elements to the interior surface of the chamber is effected through an opening 38 in the wall of said discharge chamber 37. The discharge chamber 37 also has an opening 39 providing for a discharge channel outlet.

The herein-disclosed electrode structure for an electric discharge device operates as follows.

The body 2 together with the discharge chamber 4 is preheated by the heater 7. The preheating procedure is followed by a continuous flow of argon and actively emissive elements into the space between the body 2 and the electrode 1. is extended downwardly through the opening 5 and the neck 15 with the aid of a device 40. A discharge is initiated between the rod-shaped electrode 17 and an opposite electrode structure 41 of the electric discharge device. The rod shaped electrode 17 returns to its initial position inside the discharge chamber 4. The discharge chamber 4 is filled with plasma, whereupon voltage is applied to the electrode 1. Current is supplied to the electrode 1 through a lead 20 and a cover 3, flowing through it and into the plasma and being distributed uniformly over the entire surface of contact between the electrode 1 and the plasma filling the space 4.

After the current flowing through the electrode 1 has attained the rated value, the rod-shaped electrode 17 is disconnected from the power supply source.

If required, argon is delivered along the pipe line 16 into the space between the neck 15 and the bottom plate 14 (when working with reduction or oxidizing medium).

To maintain the requisite temperature conditions of the electrode structure operation, a heat-exchanger 10 and a conduit 12 of the flange 11 are provided. Temperature control of the electrode structure is carried out by adjusting the cooling intensity.

What is claimed is:

1. An electrode structure for an electric discharge device, comprising: a discharge chamber serving as an electrode having an inner space filled completely with plasma in the course of operation and an inner surface for the transfer of electric current from said discharge chamber to said plasma under conditions of a distributed discharge; a current conductor positionable within said discharge chamber to supply said inner surface with electric current; means to provide a discharge channel outlet from said inner space of said discharge chamber; means to deliver a fluid containing actively emissive elements to said inner surface of said discharge chamber to provide distributed discharge conditions on said inner surface; means to maintain the temperature in said discharge chamber at a preset level for evaporating and ionizing the actively emissive elements in order to produce distributed discharge conditions; and means for primary initiation of a discharge.

2. An electrode structure for an electric discharge device as defined in claim 1, wherein said means to provide a discharge channel outlet from said inner space of said discharge chamber comprises: a wall of said discharge chamber having an opening; a neck attached to said opening and made of a porous electrically insulating material; a bottom plate embracing said neck and forming with said neck a circular cavity that is insulated electrically from all current conducting parts of said electrode structure; and means to introduce a protective gas into said circular cavity to pass the protective gas flow through said neck in order to prevent harmful gases penetrating into said inner space of said discharge chamber.

3. An electrode structure for an electric discharge device as defined in claim 1, wherein said means to deliver the fluid containing actively emissive elements to said inner surface of said discharge chamber comprises: a wall of said discharge chamber made at least partially of a heat-resistant electrically conductive fluid-permeable material; a body embracing said discharge chamber forming a cavity with said wall; and means to introduce a fluid comprising actively emissive elements into said cavity causing said fluid to flow through said wall to said inner surface of said wall.

4. An electrode structure for an electric discharge device as defined in claim 1, wherein said means to maintain the temperature in the discharge chamber at a preset level comprises: an electric heater; heat insulation; and a housing having a heat exchanger.

5. An electrode structure for an electric device as defined in claim 1, wherein said means for primary initiation of a discharge comprises: a rod-shaped electrode adapted to move longitudinally between a first and second terminal positions, the end of said electrode rod being disposed inside said discharge chamber in the first position and said rod-shaped electrode extending through said neck beyond said electrode structure in the second position; means to initiate a discharge between said rod-shaped electrode and an opposite electrode structure of said electric discharge device; and means to move said rod-shaped electrode.

* * * * *